(12) United States Patent
Grillberger et al.

(10) Patent No.: US 7,829,357 B2
(45) Date of Patent: Nov. 9, 2010

(54) METHOD AND TEST STRUCTURE FOR MONITORING CMP PROCESSES IN METALLIZATION LAYERS OF SEMICONDUCTOR DEVICES

(75) Inventors: Michael Grillberger, Radebeul (DE); Matthias Lehr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 69 days.

(21) Appl. No.: 12/165,725

(22) Filed: Jul. 1, 2008

(65) Prior Publication Data

US 2009/0140246 A1 Jun. 4, 2009

(30) Foreign Application Priority Data

Nov. 30, 2007 (DE) .................. 10 2007 057 684

(51) Int. Cl.
*H01L 21/00* (2006.01)
(52) U.S. Cl. .................. 438/18; 438/633; 438/645
(58) Field of Classification Search ............. 438/14–18, 438/692, 633, 645
See application file for complete search history.

(56) References Cited

U.S. PATENT DOCUMENTS 5,952,674 A 9/1999 Edelstein et al. .............. 257/48

OTHER PUBLICATIONS

Translation of Official Communication from German Patent Office for German Patent Application No. 10 2007 057 684.8 dated Oct. 28, 2008.

*Primary Examiner*—Richard A. Booth
(74) *Attorney, Agent, or Firm*—Williams, Morgan & Amerson, P.C.

(57) ABSTRACT

By forming a large metal pad and removing any excess material thereof, a pronounced recessed surface topography may be obtained, which may also affect the further formation of a metallization layer of a semiconductor device, thereby increasing the probability of maintaining metal residues above the recessed surface topography. Consequently, by providing test metal lines in the area of the recessed surface topography, the performance of a respective CMP process may be estimated with increased efficiency.

17 Claims, 7 Drawing Sheets

METHOD AND TEST STRUCTURE FOR MONITORING CMP PROCESSES IN METALLIZATION LAYERS OF SEMICONDUCTOR DEVICES

BACKGROUND OF THE INVENTION

1. Field of the Invention

Generally, the subject matter disclosed herein relates to the field of manufacturing integrated circuits, and, more particularly, to chemical mechanical polishing (CMP) process techniques used for the formation of metallization structures of semiconductor devices.

2. Description of the Related Art

Typically, the fabrication of modern integrated circuits requires a large number of individual process steps, wherein a typical process sequence involves the deposition of conductive, semiconductive or insulating layers on an appropriate substrate. After deposition of the corresponding layer, device features are produced by patterning the corresponding layer with well-known means, such as photolithography and etching. As a consequence, by patterning a deposited layer, a certain topography will be created that also affects deposition and patterning of subsequent layers. Since sophisticated integrated circuits require the formation of a plurality of subsequent levels, it has become standard practice to periodically planarize the surface of the substrate to provide well-defined conditions for deposition and patterning of subsequent material layers. This holds especially true for so-called metallization layers in which metal interconnects are formed to electrically connect the individual device features, such as transistors, capacitors, resistors and the like, to establish the functionality required by the circuit design.

In this respect, CMP has become a widely used process technique for reducing "imperfections" in the substrate topography caused by preceding processes in order to establish enhanced conditions for a subsequent process, such as photolithography and the like. Although the polishing process itself causes mechanical damage to the polished surface, however, in an extremely low range, i.e., at an atomic level, depending on the process conditions, unwanted material may be removed at moderately high rates and with a relatively high degree of uniformity. However, CMP processes also have a plurality of side effects that have to be addressed so as to be applicable to processes required for forming sophisticated semiconductor devices.

For example, the so-called damascene or inlaid technique has become a preferred method in forming metallization layers, wherein a dielectric layer is deposited and patterned to receive trenches and vias that are subsequently filled with an appropriate metal, such as aluminum, copper, copper alloys, silver, tungsten and the like. Since the process of providing the metal may be performed as a "blanket" deposition process based on, for instance, electrochemical deposition techniques, the respective pattern of the dielectric material may require a significant over-deposition in order to reliably fill narrow openings and wide regions or trenches in a common process. The excess metal is then removed and the resulting surface is planarized by performing a process sequence comprising one or more mechanical polishing processes, which also include a chemical component. Chemical mechanical polishing (CMP) has proven to be a reliable technique to remove the excess metal and planarize the resulting surface so as to leave behind metal trenches and vias that are electrically insulated from each other as required by the corresponding circuit layout. Chemical mechanical polishing typically requires the substrate to be attached to a carrier, a so-called polishing head, such that the substrate surface to be planarized is exposed and may be placed against a polishing pad. The polishing head and polishing pad are moved relative to each other usually by individually moving the polishing head and the polishing pad. Typically, the head and pad are rotated against each other while the relative motion is controlled to locally achieve a target material removal rate. During the polishing operation, typically a slurry that may include a chemically reactive agent and possibly abrasive particles is supplied to the surface of the polishing pad.

One problem involved in the chemical mechanical polishing of substrates is the very different removal rates of differing materials, such as of a metal and a dielectric material from which the excess metal has to be removed. For instance, at a polishing state where the dielectric material and the metal are simultaneously treated, i.e., after the major portion of the metal has already been removed, the removal rate for the metal typically exceeds the removal rate for the dielectric material. This may be desirable to a certain degree because all metal is to be reliably ablated from all insulating surfaces, thereby insuring the required electrical insulation. On the other hand, significant metal removal from trenches and vias may result in a trench or via that exhibits an increased electrical resistance due to the reduced cross-sectional area. Moreover, the local removal rate may significantly depend on the local structure, i.e., on the local pattern density, which may result in a locally varying degree of erosion of the dielectric material in a final state of the polishing process. In order to more clearly demonstrate a typical damascene process, reference is made to FIGS. 1a-1c.

Figure 1A:
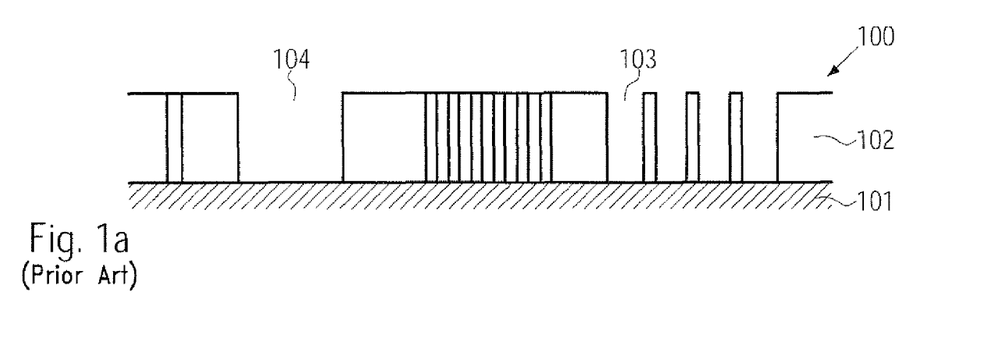
FIGS. 1a-1c schematically illustrate cross-sectional views of a semiconductor device during various manufacturing stages in forming an advanced metallization structure using a CMP process for removing excess metal and substantially planarizing the resulting surface topography according to conventional strategies.
Figure 1B:
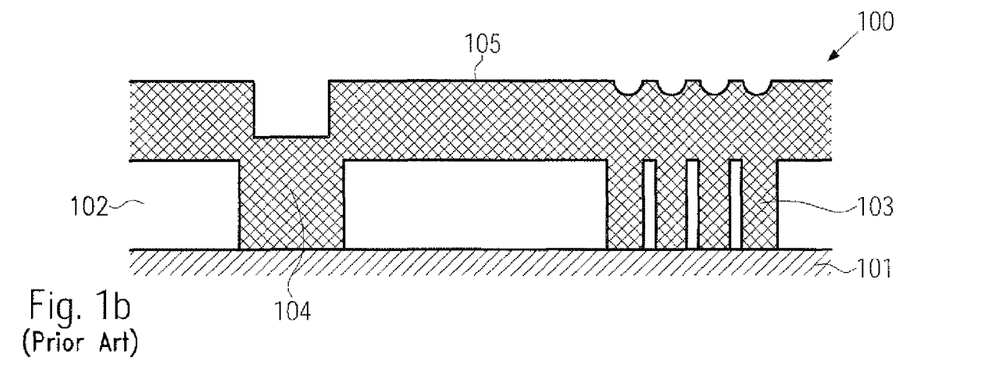
Figure 1C:
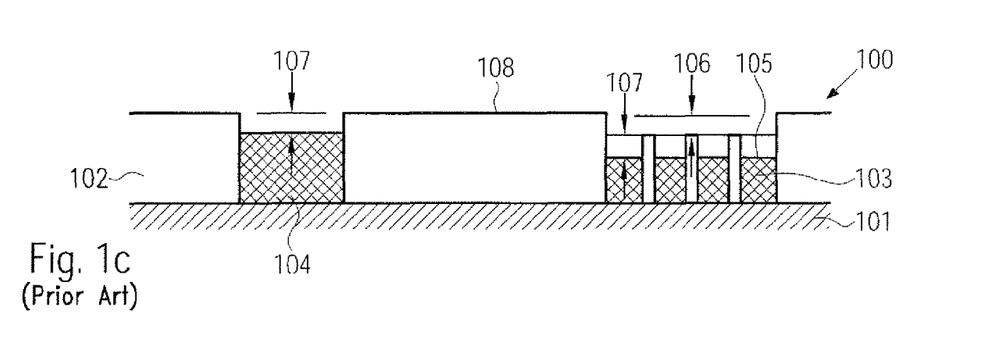

FIGS. 1a-1c schematically show cross-sectional views of a semiconductor structure 100 at various stages in fabricating a metallization layer according to a typical damascene process sequence.

In FIG. 1a, the semiconductor structure 100 comprises a substrate 101 bearing circuit features (not shown) and an insulating cap layer on which metal lines are to be formed. A patterned dielectric layer 102 is formed over the substrate 101 and includes openings, for example, in the form of narrow trenches 103 and wide trenches 104. The openings for trenches 103 and 104 are patterned in conformity with design rules of the metallization level under consideration to establish metal lines exhibiting the required electrical characteristics in terms of functionality and conductivity. For instance, the trench 104 is designed as a so-called wide line to provide low electrical resistance. The deposition of the dielectric material 102, as well as the patterning of the trenches 103 and 104, is carried out by well-known deposition, etching and photolithography techniques.

FIG. 1b schematically depicts the semiconductor structure 100 after deposition of a metal layer 105, for example, a copper layer when sophisticated integrated circuits are considered. As is evident from FIG. 1b, the topography of the metal layer 105 will be affected by the underlying pattern of the dielectric layer 102. The metal layer 105 may be deposited by chemical vapor deposition, sputter deposition or, as usually preferred with copper, by electroplating with a preceding sputter deposition of a corresponding copper seed layer. Although the precise shape of the surface profile of the metal layer 105 may depend on the deposition technique used, in principle, a surface topography will be obtained as shown in FIG. 1b.

Subsequently, the semiconductor structure 100 will be subjected to the chemical mechanical polishing in which, as previously mentioned, the slurry and polishing pad are selected to optimally remove the excess metal in the metal layer 105. During the chemical mechanical polishing, the excess metal is removed and finally surface portions 108 (FIG. 1c) of the dielectric material 102 will be exposed, wherein it is necessary to continue the polishing operation for a certain overpolish time to ensure clearance of the metal from all insulating surfaces in order to avoid any electrical short between adjacent metal lines. As previously mentioned, the removal rate of the dielectric material and the metal may significantly differ from each other so that upon overpolishing of the semiconductor structure 100, the copper in the trenches 103 and 104 will be recessed.

FIG. 1c schematically shows a typical result of chemical mechanical polishing the structure shown in FIG. 1b. As is evident from FIG. 1c, during overpolishing of the semiconductor structure 100, different materials are simultaneously polished with different removal rates. The removal rate is also dependent to some degree on the underlying pattern. For instance, the recessing of the metals during the overpolish time, which is also referred to as dishing, as well as the removal of the dielectric material, also referred to as erosion, is significantly affected by the type of pattern to be polished. In FIG. 1c, dishing and erosion at the wide trenches 104, as indicated by 107 and 106, respectively, are relatively moderate, whereas at the narrow lines 103, dishing 107 and erosion 106 may be significantly increased. For obtaining a required electrical conductivity, circuit designers have to take into consideration a certain degree of dishing and erosion, which may not be compatible with design requirements of sophisticated semiconductor devices.

Consequently, the CMP process used for removing excess material and planarizing the resulting surface topography of metallization layers has to be performed on the basis of tightly set parameter ranges, in particular when highly scaled semiconductor devices are considered. Therefore, in addition to complex control strategies used for advanced CMP processes, appropriate measurement data are usually generated on the basis of respective test structures, as will be described in more detail with reference to FIG. 1d.

Figure 1D:
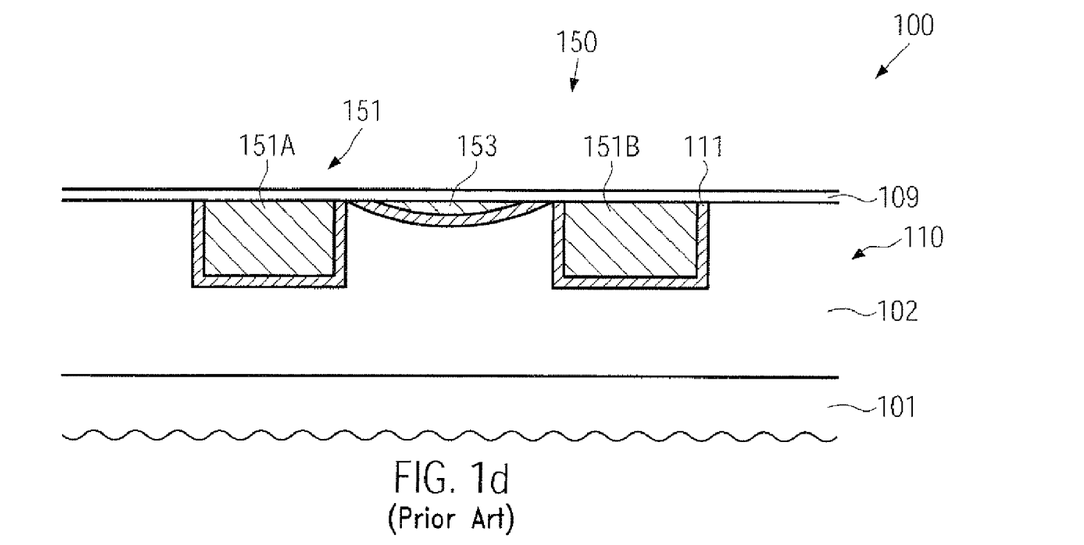
FIG. 1d schematically illustrates a test region including a test structure on the basis of metal lines formed in accordance with design rules for evaluating the CMP process according to conventional strategies.

FIG. 1d schematically illustrates a cross-sectional view of the semiconductor device 100, which now comprises a test area 150 for evaluating the CMP process used for removing excess material during the formation of the metal regions 104, 105 in a device area, as previously described with reference to FIGS. 1a-1c. For this purpose, the metallization level under consideration, indicated as metallization layer 110, comprises a pair of metal regions 151, i.e., respective metal lines 151A, 151B, which may be formed on the basis of the respective design rules of the metallization layer 110 and of respective design rules of a metallization layer located below the layer 110. Thus, the metal lines 151A, 151B may be formed on the basis of the same process sequence as previously described, wherein, during the removal of the excess material, depending on the quality of the respective CMP process, metal residues may still be present between the metal lines 151A, 151B. For instance, it may be assumed that the CMP process may result in the creation of metal residues, for instance, due to a variation of one or more process parameters, thereby resulting in a leakage path 153, which may be comprised of a barrier material 111, which is typically used in combination with copper-based metallization layers, and a respective copper material. Thus, after the deposition of the insulating cap layer 109, which may be comprised of silicon nitride, nitrogen-enriched silicon carbide and the like, a conductive path may be established between the metal lines 151A, 151B, which may be electrically detected by connecting the lines 151A, 151B to an external electrical test device. For this purpose, an appropriate interconnect structure may be provided in the test area 150 to enable access to the metal lines 151A, 151B at any appropriate manufacturing stage. For example, the metal lines 151A, 151B may be accessed after forming the metallization layer 110, thereby providing feedback measurement data for controlling the CMP process for subsequent semiconductor devices. Although a certain degree of evaluation of the CMP process may be accomplished on the basis of the test area 150, the determination of the current performance of the CMP process in a more quantitative manner is very difficult, since the test structure defining the metal lines 151A, 151B may allow a respective quantitative assessment when the leakage path 153 is actually created during the CMP process. Thus, with respect to identifying the "position" of the currently used set of parameters within the tightly set "process window" of the CMP process, the amount of information obtained from the test structure 150 may not be sufficient.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and respective test structures for evaluating planarization processes used during the formation of metallization layers of advanced semiconductor devices by using sensitive leakage test structures in order to obtain more detailed information about the performance of the planarization process to be evaluated. For this purpose, the surface topography of a material layer within a test region may be appropriately modified, that is, recessed within well-defined lateral dimensions so as to slightly modify the topography of a metallization layer to be formed above the modified surface topography. Consequently, during a respective process sequence for defining metal regions, the probability of creating a leakage path during the CMP process may be increased, thereby obtaining respective leakage paths for CMP parameter values, which may still be acceptable in the respective device areas while nevertheless providing valuable information with respect to the performance of the CMP process. For instance, by intentionally violating respective design rules, the intentionally generated surface topography, which would not be acceptable in device regions, may therefore provide enhanced measurement resolution and sensitivity. Thus, evaluation and control of the CMP process may be enhanced.

One illustrative method disclosed herein comprises generating a recessed surface area in a first metallization layer of a test area for a semiconductor device by performing a first CMP process on the first metallization layer. The method further comprises forming a first metal region and a second metal region in a leakage area of a second metallization layer that is formed on the first metallization layer by filling openings in the leakage area with a metal and removing excess metal by performing a second CMP process, wherein the leakage area is aligned to the recessed surface area. Moreover, the method comprises evaluating the second CMP process by determining a leakage current between the first and second metal regions.

A further illustrative method disclosed herein relates to the evaluation of a CMP process in which the method comprises forming a leakage test structure by forming a layer portion of a material layer in a test area of a semiconductor device so as to have a laterally defined recessed surface topography. Forming the leakage test structure further comprises forming a metallization layer above the material layer and using the CMP process for removing excess material of the metallization layer, which comprises a first metal region and a second metal region that are formed above the layer portion and have a distance according to a predefined target value. Furthermore, the method comprises determining a leakage current in the test structure in order to evaluate the CMP process.

An illustrative leakage test device disclosed herein comprises a material layer formed above a substrate that is usable for forming semiconductor devices wherein the material layer comprises a first layer portion having a recessed surface topography. The leakage test device further comprises a metallization layer formed above the material layer. Furthermore, a first pair of metal regions including a first metal region and a second metal region is formed in the metallization layer and is aligned to the first layer portion, wherein the first and second metal regions have a lateral distance according to a predefined first target value. The leakage test device further comprises a first leakage region formed laterally between the first pair of metal regions, wherein the first leakage region has a lateral extension that is substantially defined by the recessed surface topography of the first layer portion, wherein the first pair and the first leakage region form a first test structure. Moreover, the leakage test device comprises an interconnect structure configured to enable electrical connection of the first test structure to an external electrical test tool.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides methods and test devices which have an increased sensitivity with respect to the evaluation of CMP processes by increasing the probability of creating metal residues and thus leakage paths by intentionally establishing a surface topography below a metallization layer to be evaluated so as to potentially intentionally violate design rules and thus create sophisticated conditions during the respective CMP process. The evaluation of the CMP process may include the determination of at least one parameter describing the probability of producing metal residues during the CMP process to be evaluated. For instance, the presence of a leakage current, the magnitude of the leakage current or the electrical resistance of the leakage path may be used as evaluation parameters for the CMP process under consideration. These measurement values obtained from the test structures and methods disclosed herein may also be used as feedback measurement data for advanced APC techniques. As previously explained, the provision of metal lines or any other metal regions in a respective metallization layer may be substantially determined by the minimum critical dimension that may be achieved for the device layer under consideration. That is, lithography and respective etch processes may be selected to provide a desired minimum critical dimension of, for instance, trenches, wherein a minimum lateral distance between respective trenches and thus metal lines may also be defined by the minimum critical dimension. Thus, in conventional leakage test structures for evaluating CMP processes, the detection resolution for identifying a leakage path between two neighboring metal lines is restricted by the critical dimension of the metallization layer under consideration. Hence, as long as a leakage path is not created by the CMP process under consideration, an evaluation of the current status of the CMP process may be difficult to be achieved, thereby rendering conventional techniques less efficient, in particular when sophisticated semiconductor devices are considered, having significant differences in pattern density that usually results in pronounced surface topographies and hence require very tight process windows. As previously explained, sophisticated parameter settings may be required, which may have to be maintained within tightly set process margins, wherein an evaluation of process parameters, even within a valid process window, may be highly desirable so as to identify even subtle process variations and enable enhanced process control by using respective electrical measurement data as additional information for APC (advanced process control) strategies. According to the subject matter disclosed herein, the sensitivity of a test structure may be increased for a given critical dimension of a metallization layer under consideration by appropriately modifying the surface topography of a material layer located below the metallization layer in order to provide process conditions for the CMP process to be evaluated, which may increase the probability of creating metal residues and thus a leakage path. In this case, for a given lateral distance of respective test metal lines in the metallization layer, a leakage path may already be created for CMP parameters, which may still be acceptable in device regions while nevertheless enabling the detection and evaluation of the leakage path in the test area which may thus also provide information with respect to the performance of the CMP process under consideration.

In some illustrative aspects disclosed herein, the appropriate surface topography of the underlying material layer may be created by a CMP process, wherein a material of a significant different removal rate may be provided so as to obtain a recessed topography with respect to the neighboring material. For instance, a metal region of appropriate size may be formed, without being restricted to any design rule, which may experience a significant degree of dishing during a respective CMP process, thereby creating a respective recessed surface topography, the lateral extension of which is substantially defined by the lateral dimensions of the metal region. Due to the dishing effect intentionally created, the formation of the subsequent metallization layer may also experience a slightly modified surface topography, which may result in a higher probability for creating metal residues due to the more sophisticated process conditions, wherein the degree of creation of metal residues may depend on the status of the CMP process. Thus, by providing one or more pairs of test metal lines having a different lateral distance, an appropriate evaluation of leakage paths and thus CMP characteristics may be accomplished. Additionally or alternatively, a plurality of recessed surface topographies of different lateral dimension may be created and may be combined with respective pairs of test metal lines, which may have the same or a different lateral distance, in order to evaluate the CMP process used for removing excess material when forming the test metal lines. In other cases, the recessed surface topography of well-defined lateral dimensions may be created by other mechanisms, such as an etch process and the like. As will be further described later on in more detail, the techniques and test structures disclosed herein may be provided for any metallization level, even for the very first metallization level, for instance, by forming a respective surface topography in the contact layer of a semiconductor device, thereby enabling the monitoring of respective CMP processes for any desired metallization level. Furthermore, the test structures disclosed herein may be efficiently combined with an efficient test structure chain on the basis of only a small number of probe pads, thereby maintaining the area consumed by the test structure at a low level, while providing high sensitivity at reduced access times during the measurement.

Figure 2A:
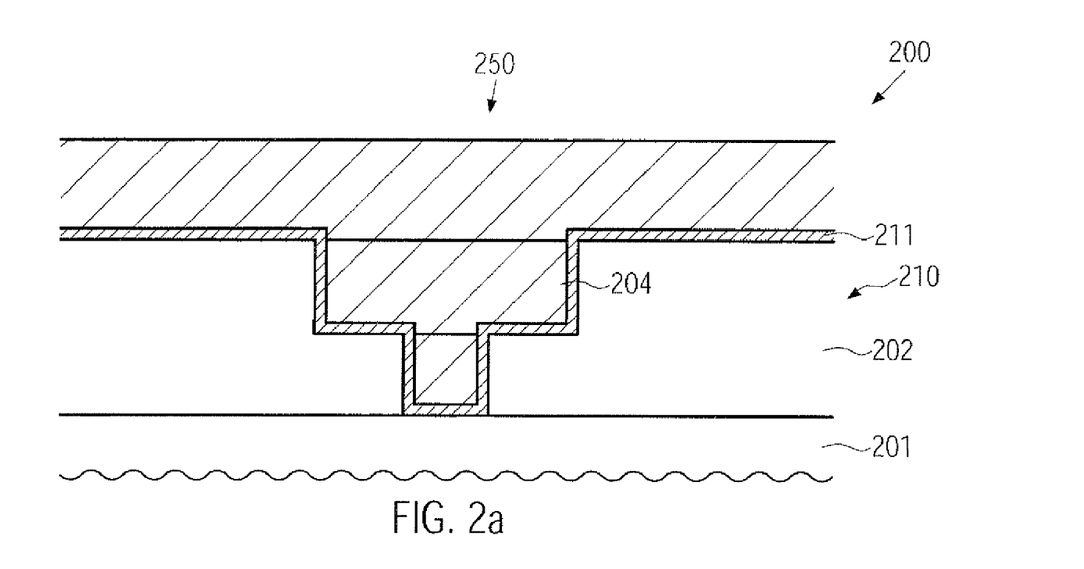
FIGS. 2a-2c schematically illustrate cross-sectional views of a semiconductor device or a test device during various manufacturing stages in forming a test structure having an increased sensitivity with respect to process parameters used for removing excess material of a metallization layer according to illustrative embodiments.

FIG. 2a schematically illustrates a cross-sectional view of a test device 200 which may represent a portion of a semiconductor device or which may represent a specific device region during the manufacturing of semiconductor devices, while, in other cases, the device 200 may be formed on dedicated test substrates. The device 200 may comprise a substrate 201, which may represent any appropriate carrier material for forming thereon and therein semiconductor devices which require one or more wiring levels, i.e., metallization layers, providing the electrical connections corresponding to the specified circuit layout. Thus, the substrate 201 may represent a semiconductor material, an insulating material having formed thereon a semiconductor layer such as silicon substrates, silicon-on-insulator (SOI) substrates and the like. It should be appreciated that the substrate 201 may comprise a device region in which may be formed circuit elements, such as transistors, capacitors, resistors and the like, as are typically provided in integrated circuits. For convenience, any such circuit elements are not shown in FIG. 2a. In other cases, the substrate 201 may comprise a plurality of test structures and the like which may be used for various test procedures, while functional semiconductor devices may also be formed thereon, which may also be used for measurement processes and the like. The device 200 may comprise a material layer 210, which, in illustrative embodiments, may represent a metallization layer including a dielectric material 202 and a metal region 204. The dielectric material 202 may be comprised of any appropriate material, such as conventional dielectrics in the form of silicon dioxide, silicon nitride, silicon oxynitride and the like, while also low-k dielectric materials, i.e., materials having a relative permittivity of 3.0 and less, may be provided in the dielectric material 202. The material layer 210 may thus represent a specific layer of a semiconductor device under consideration, such as a metallization layer, a contact layer and the like. In other illustrative embodiments, the region 204 may represent any appropriate material composition in which a desired surface topography may be accomplished in a later manufacturing stage, as will be described later on with respect to FIG. 2h. Furthermore, in the embodiment shown, the metal region 204 may comprise a barrier layer 211 as may typically be used in combination with highly conductive metals, such as copper and the like. The barrier layer 211 may be comprised of any appropriate material, such as tantalum, tantalum nitride, titanium, titanium nitride and the like.

The device 200 as shown in FIG. 2a may be formed on the basis of the following processes. After forming any circuit elements, if the device 200 represents a part of a semiconductor device, or when the substrate 201 also comprises device regions, as previously explained, the dielectric material 202 may be formed on the basis of any appropriate deposition technique, such as chemical vapor deposition (CVD), spin-on techniques and the like. Next, an opening may be formed in the dielectric layer 202, wherein respective openings may also be formed above device regions if provided above the substrate 201, wherein, typically, respective design rules have to be respected when forming respective openings. The opening of a test structure 250, however, may be formed with appropriate dimensions, irrespective of the basic design rules for the layer 210 in order to obtain a desired recessed surface topography during a later manufacturing stage wherein the recess is laterally substantially defined by the respective opening formed in the test structure 250. For example, at least one lateral dimension of the opening may be selected comparable to or greater than a lateral distance of test metal lines still to be formed in a metallization layer to be formed above the layer 210. Thus, in this case, the recessed surface topography may result in an increased probability of creating metal residues when forming the subsequent metallization level, as will also be explained later on in more detail. After patterning the dielectric material 202, the barrier layer 211 may be formed in accordance with process techniques as required for forming the material layer 210. For example, advanced physical vapor deposition (PVD), atomic layer deposition (ALD), electrochemical deposition techniques and the like may be used. Thereafter, the metal layer 204 may be deposited, for instance, by electrochemical deposition techniques, wherein, if required, an appropriate seed layer may be deposited prior to forming the metal layer 204. Next, excess material of the layer 204 and the layer 211 may be removed on the basis of an appropriate process technique, for instance, electrochemical etching and/or CMP, wherein the respective removal process may result in a recessed surface topography due to a difference in removal rate between the dielectric material 202 and the material of the layers 204 and 211. For example, as previously explained, during a CMP process, the excess material of the layer 204 and the layer 211 may be removed, while also exposing the dielectric material, wherein, during a final polishing phase, increasingly, the material 204 may be removed due to its higher removal rate, since a certain overpolish time may be required, as previously explained.

Figure 2B:
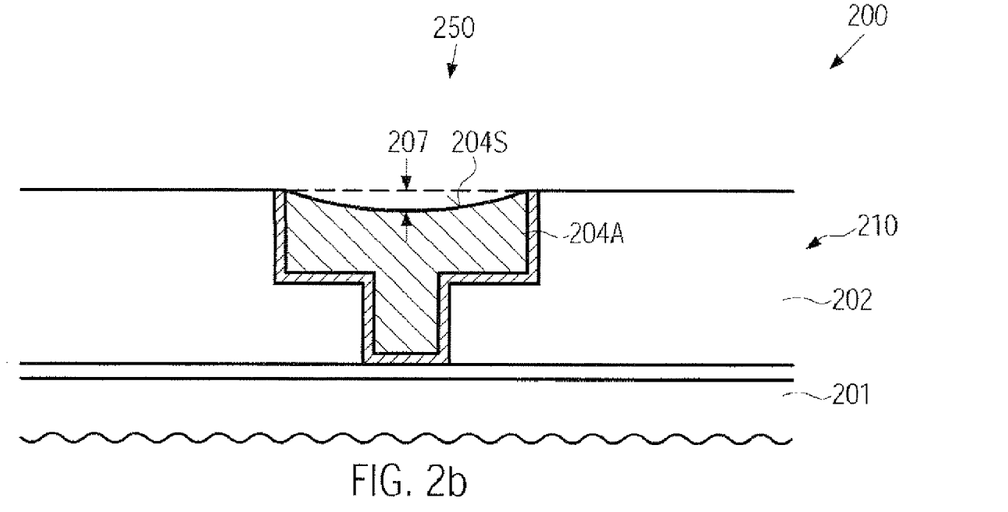

FIG. 2b schematically illustrates the device 200 after the above-described removal process. Hence the device 200 may comprise the metal region 204A having a recessed surface topography 204S with respect to the surrounding dielectric material 202, wherein the recessed surface topography 204S is substantially determined by the lateral dimension of the metal region 204A, as explained above. In the case of using a CMP process for removing the excess material of the layer 204, the surface topography 204S may be caused by the different removal rates during the CMP process, thereby creating a certain degree of dishing 207, as also explained with reference to the semiconductor device 100. In other illustrative embodiments, the recessed surface topography 204S may be accomplished by using a selective etch process, for instance by masking other device regions, if provided, and selectively removing material in the region 204A with respect to the dielectric material 202. Thus, in this case, the recessed surface topography 204S may be obtained with a reduced degree of dependency on the removal process for removing the excess material of the layer 204, thereby enhancing the overall process uniformity in defining the recessed surface topography 204S.

Figure 2C:
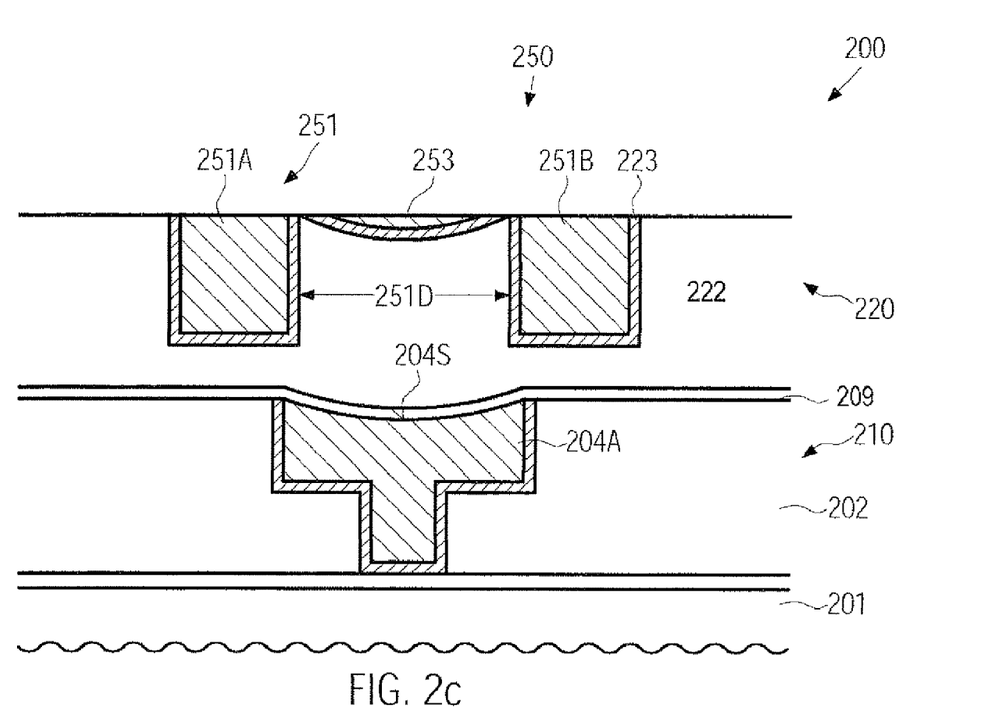

FIG. 2c schematically illustrates the device 200 in a further advanced manufacturing stage. As shown, the device 200 may comprise a metallization layer 220 formed above the material layer 210 and separated therefrom by a respective cap layer 209. The metallization layer 220 may comprise a dielectric material 222, which may comprise any appropriate material composition, such as conventional dielectrics, low-k dielectrics and the like, as is also previously explained with reference to the dielectric material 202. Furthermore, a pair of metal regions 251 are formed within the test region 250 so as to be aligned with the recessed surface topography 204S, wherein the pair 251 comprise a first metal region 251A, for instance in the form of a metal line, and a second metal region 251B, for instance in the form of a metal line. The metal regions 251A, 251B may be provided with a lateral distance 251D, which may be selected on the basis of device requirements, that is, the distance 251D may, in some illustrative embodiments, represent the minimum critical distance for metal lines of the metallization layer 220, while, in other illustrative embodiments, the distance 251D may be made greater with respect to increasing the measurement range, if, for instance, a plurality of pairs 251 may be provided, as will be explained later on in more detail. The lateral distance 251D may be less compared to the lateral distance of the region 204A so that the recessed surface topography 204S may laterally accommodate the distance 251D. In this case, the probability for creating a leakage path between the metal regions 251A, 251B may be significantly increased so that a leakage path 253 may be formed between the regions 251A, 251B.

The device 200 as shown in FIG. 2c may be formed on the basis of the following processes. After creating the recessed surface topography 204S, the cap layer 209 may be formed on the basis of any appropriate technique, for instance, by depositing silicon nitride, silicon carbide, nitrogen-containing silicon carbide or any combination of these materials, depending on process requirements. Next, the dielectric material 222 may be formed, for instance, by spin-coating, CVD or any other appropriate deposition technique corresponding to the metallization layer 220. Next, the dielectric material 222 may be patterned on the basis of photolithography and etch techniques in accordance with process requirements and the design rules for the metallization layer 220. For example, the lateral size of the metal regions 251A, 251B may be defined on the basis of the lateral size of respective metal lines as may be used in device regions, while, in other cases, any appropriate lateral size may be used so as to establish respective conditions for a CMP process to be performed for removing any excess metal. Similarly, as described with reference to the layer 210, also in this case, a barrier material 223, if required, may be formed on exposed surfaces of the patterned dielectric material 222, which may be accomplished on the basis of any appropriate deposition technique, as is also previously explained with reference to barrier layer 211. Thereafter, the metal, such as copper, copper alloy and the like, may be deposited, possibly on the basis of a previously formed seed layer, thereby also producing a certain amount of excess material. Next, the excess material may be removed on the basis of a CMP process, thereby requiring tightly set process parameters, as is previously explained with reference to FIG. 1c, since sophisticated surface topographies in combination with highly scaled feature dimensions may occur in metallization layers of sophisticated semiconductor devices. During the CMP process, the recessed surface topography, which may still, to a more-or-less degree, be present after the deposition of the layers 209 and the material 222, may result in an increased probability of creating not completely removed metal residues on the basis of the respective CMP recipe, thereby obtaining the leakage path 253. Thus, the leakage path 253 may be created by process parameters which may still be within an acceptable range, since the surface topography 204S may have been obtained on the basis of the region 204A, which may not correspond to the design rules for the layer 210.

Thus, by detecting a leakage current between the metal regions 251A, 251B, for instance, on the basis of an appropriately configured interconnect structure (not shown) and by connecting an external electrical measurement tool, the performance of a CMP process may be monitored with increased sensitivity since the leakage path 253 may be established with higher probability compared to conventional strategies in which the detection sensitivity is substantially determined by the critical minimum distance between respective test metal lines, as explained with reference to FIG. 1d.

Figure 2D:
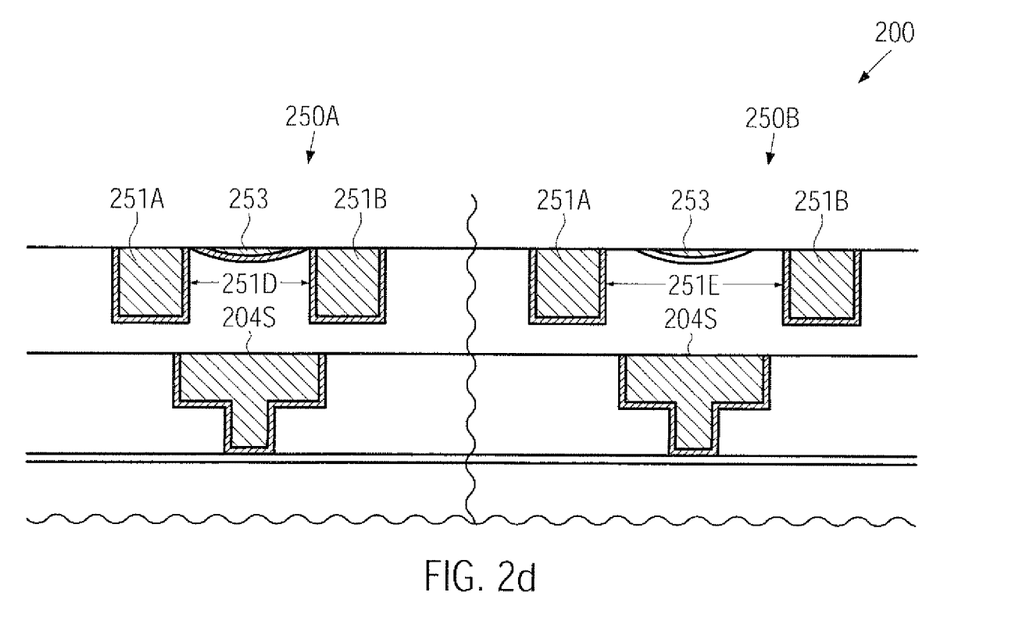
FIG. 2d schematically illustrates a test area of a semiconductor device including two or more test structures for enhancing the overall sensitivity and efficiency for evaluating process parameters of a CMP process according to still further illustrative embodiments.

FIG. 2d schematically illustrates the test device 200 according to further illustrative embodiments in which two or more test structures 250A, 250B may be provided, which may basically have the same configuration as the test structure 250 except for a different probability for creating a leakage path between the respective metal regions 251A, 251B. In the embodiment shown, the test structure 250A may be formed on the basis of the recessed surface topography 204S, as shown in FIG. 2c, while also the metal regions 251A, 251B may have the lateral distance 251D, which may correspond to a specified design target value, such as a minimum critical dimension for the metallization layer 220. Similarly, the test structure 250B may be formed on the basis of the recessed surface topography 204S, which may be provided by a metal region having the same configuration as the metal region 204A. However, the metal regions 251A, 251B may be formed with an increased lateral distance 251E, which may be similar to or greater than a lateral dimension of the recessed surface topography 204S. Thus, the probability of creating a leakage path between the metal regions 251A, 251B may be less pronounced, although metal residues 253 may also be created due to the recessed surface topography 204S.

Figure 2E:
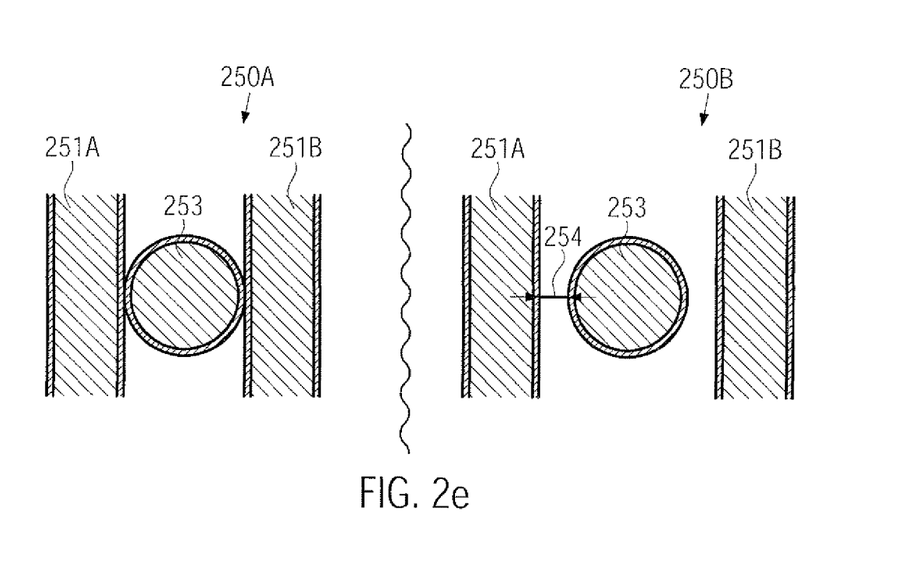
FIG. 2e schematically illustrates a top view of the test region of FIG. 2d.

FIG. 2e schematically illustrates the device 200 in a top view. As shown, a substantially circular shape may be used in the embodiment shown for the metal region 204A, thereby resulting in a leakage region 253 that also has a substantially circular shape. In this case, a continually increasing conductive path may be created, since the leakage region 253 may increasingly "overlap" with metal lines 251A, 251B, when the radius of the leakage region 253 increases with a decreasing performance of the CMP process under consideration, which may translate into a more sensitive variation of the finally created resistance of the leakage path defined by the region 253. It should be appreciated, however, that any other shape may be used, such as a square shape, a rectangular shape and the like. It may further be assumed that the device 200 may have been formed on the basis of a CMP process that results in the creation of a leakage path for the test structure 250A, that is, the leakage region 253 may be in contact with the metal regions 251A, 251B so that actually a current flow may be obtained when contacting the regions 251A, 251B of the test structure 250A by means of an external electrical measurement device. On the other hand, the performance of the CMP process may be sufficient to remove the excess material at portions between the lines 251A, 251B in which the surface topography 204S is less pronounced or is no longer present, depending on the magnitude of the lateral distance 251E. Thus, in this case, a gap 254 may be provided between the leakage region 253 and the corresponding metal lines 251A, 251B. In this case, upon contacting the metal lines 251A, 251B of the second test structure 250B, additional measurement information is available for evaluating the respective CMP process. For instance, if performance of the CMP process may decrease, for instance, due to degradation and the like, the gap 254 may be reduced and may, for a specific degree of performance loss, result in a leakage path which may then be detected when contacting the second test structure 250B with the external device. Thus, the respective performance loss of the CMP process may be detected with high reliability and efficiency wherein the respective detection may, for instance, correspond to still an acceptable status of the CMP process, while nevertheless indicating that the CMP process is approaching into an area of the process window that corresponds to invalid process conditions.

On the other hand, if the CMP process under consideration may exhibit a highly "aggressive" removal behavior which may result in an electrically isolated region 253 in the first test structure 250A, also in this case, enhanced detection sensitivity may be accomplished compared to conventional strategies.

Figure 2F:
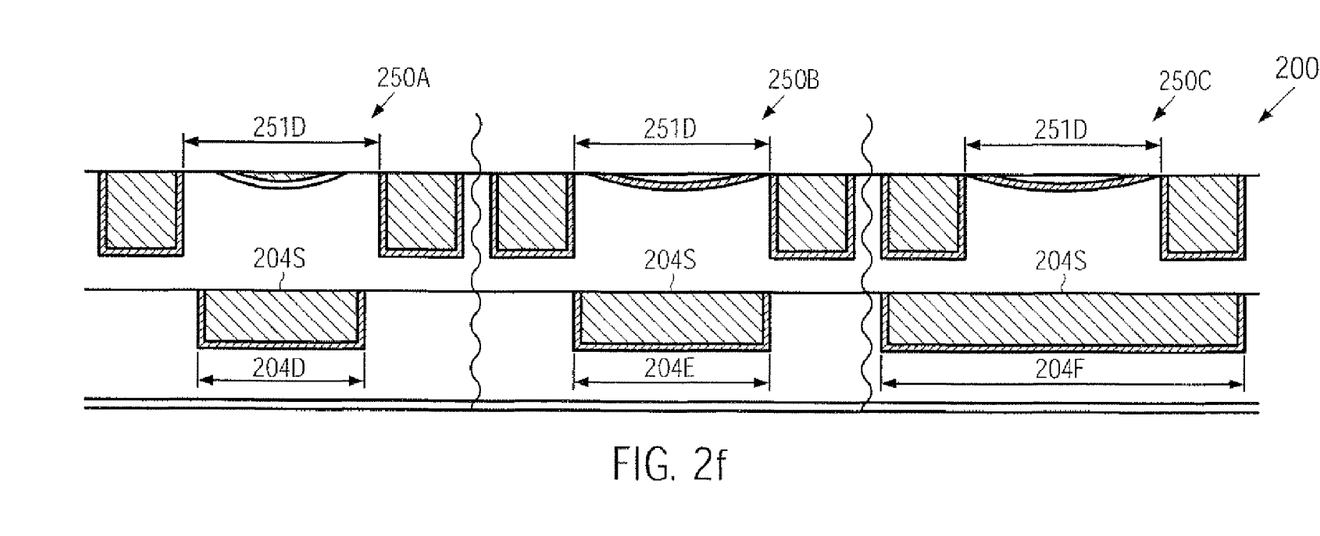
FIGS. 2f-2g schematically illustrate a cross-sectional view and a top view, respectively, of a test area including a plurality of test structures with different recessed surface topography and thus different leakage regions according to further illustrative embodiments.

FIG. 2f schematically illustrates the device 200, which comprises a plurality of test structures 250A, 250B, 250C that have different probabilities for creating a leakage path during a CMP process. In the embodiment shown, the test structures 250A, 250B, 250C may have similar configurations with respect to the lateral distance 251D, that is, the same target value may have been used for patterning the respective pairs 251, while the corresponding recessed surface topographies 204S may be different for each of the test structures 250A, 250B, 250C. Hence, the surface topographies 204S may have different lateral dimensions 204D, 204E, 204F, thereby resulting in different CMP conditions and thus in a different probability for creating leakage paths in the respective test structures 250A, 250B, 250C. In the embodiment shown, the test structure 250C comprising the recessed surface topography 204S on the basis of the largest lateral dimension 204F may have the highest probability for creating a leakage path, since metal residues may remain with high probability due to the pronounced topography between the metal lines 251A, 251B of the test structure 250C. Similarly, the test structure 250B may have a less pronounced probability of actually contacting the metal lines 251A, 251B since the lateral extension 204E and thus resulting surface topography may be less compared to the test structure 250C. Finally, the respective probability may be lowest in the test structure 250A due to the smallest lateral extension 204D.

Figure 2G:
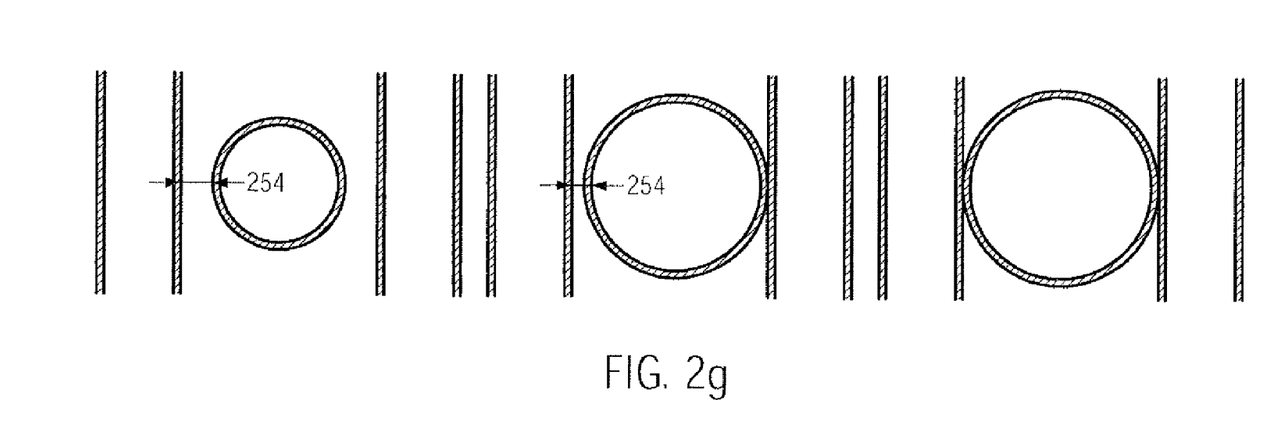

FIG. 2g schematically illustrates a top view of the device 200 of FIG. 2f, thereby illustrating that a respective isolation 254 may still be present in the test structures 250B, 250A, while an actual leakage path is established in the test structure 250C. Consequently, by appropriately contacting the test structures 250A, 250B, 250C with the external electrical measurement device, the status of the CMP process may be evaluated with increased sensitivity, wherein, for a "digital" measurement strategy, i.e., detecting whether or not a leakage path is established, a desired high resolution may be obtained by providing a desired number of test structures. In this case, low removal performance, as well as a non-desired undue aggressive removal behavior of the CMP process, may be detected on the basis of digital information and may be obtained by using an appropriate number of test structures 250A, 250B, 250C. It should be appreciated that, in the embodiments described with reference to FIGS. 2d-2g, either the lateral distances 251D, 251E of the metal regions 251A, 251B or the lateral extensions 204D, 204E, 204F of the recessed surface topography have been selected differently. In other illustrative embodiments, both parameters, i.e., the lateral distances and the lateral extensions, may be changed if deemed appropriate.

Figure 2H:
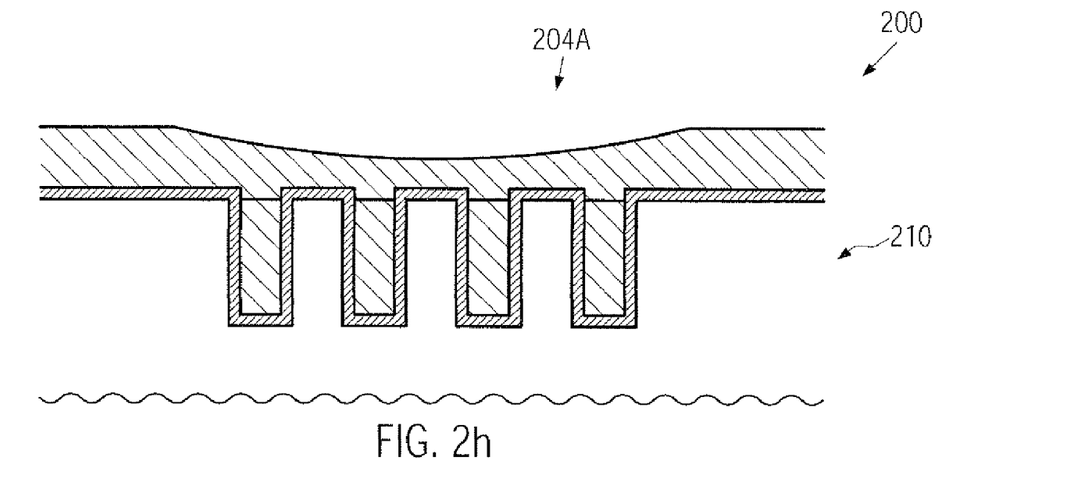
FIGS. 2h-2i schematically illustrate cross-sectional views of a test structure during various manufacturing stages, in which an increased probability for creating a leakage path is established on the basis of a layer portion including a plurality of closely spaced metal regions, according to yet further illustrative embodiments.

FIG. 2h schematically illustrates a cross-sectional view of the device 200 in which the region 204A may be defined on the basis of a plurality of closely spaced metal regions in order to create a respective recessed surface topography during the further processing of the device 200. The plurality of metal regions in the region 204A may be formed in accordance with minimum critical dimensions of the metallization layer 210 to provide the metal regions with a high degree of reproducibility, wherein the number of metal regions may be selected so as to obtain the desired lateral extension of the recessed surface topography. Thus, after forming a respective number of openings, these openings may be filled by a barrier material, if required, and a metal, as previously explained, and subsequently any excess material may be removed, for instance by CMP, wherein the pattern density obtained by the plurality of metal regions may provide an enhanced removal rate, as previously explained. Consequently, a locally recessed surface topography may be obtained in the region 204A after the completion of the CMP process.

Figure 2I:
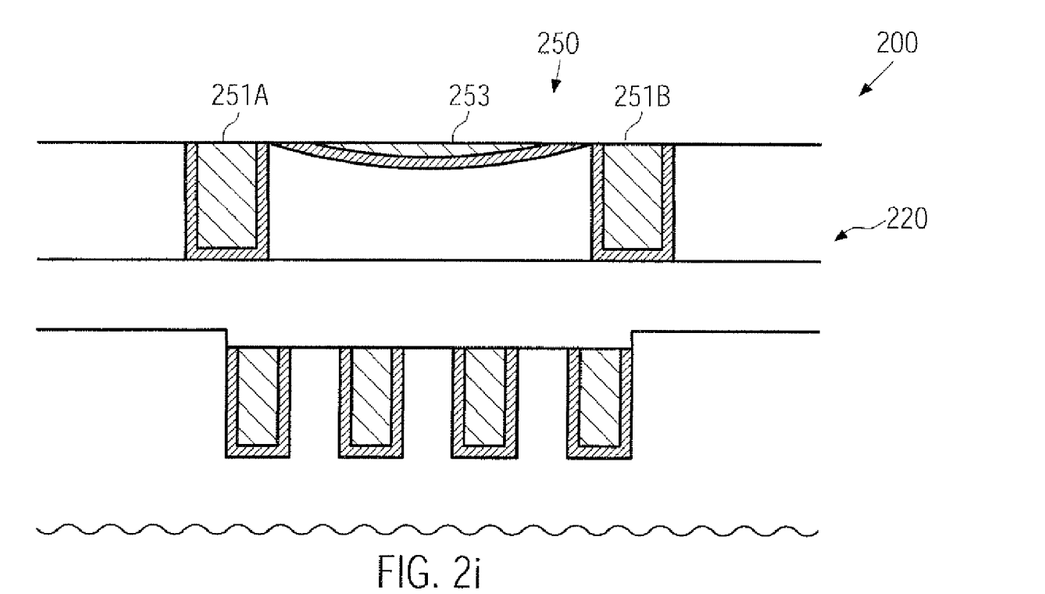

FIG. 2i schematically illustrates the device 200 in a further advanced manufacturing stage wherein the test structure 250 is provided and comprises the metal regions 251A, 251B with the leakage region 253 formed in between due to the increased probability of maintaining metal residues, as previously explained. Thus, by patterning the region 204A on the basis of a plurality of metal regions, also a significantly altered removal rate may be locally created which may result in a pronounced surface topography during the formation of the metallization 220. Thus, one or more test regions 250 may be formed so as to exhibit a different probability for creating leakage paths, wherein the probability may be varied on the basis of the lateral extension of the region 204A.

Figure 3:
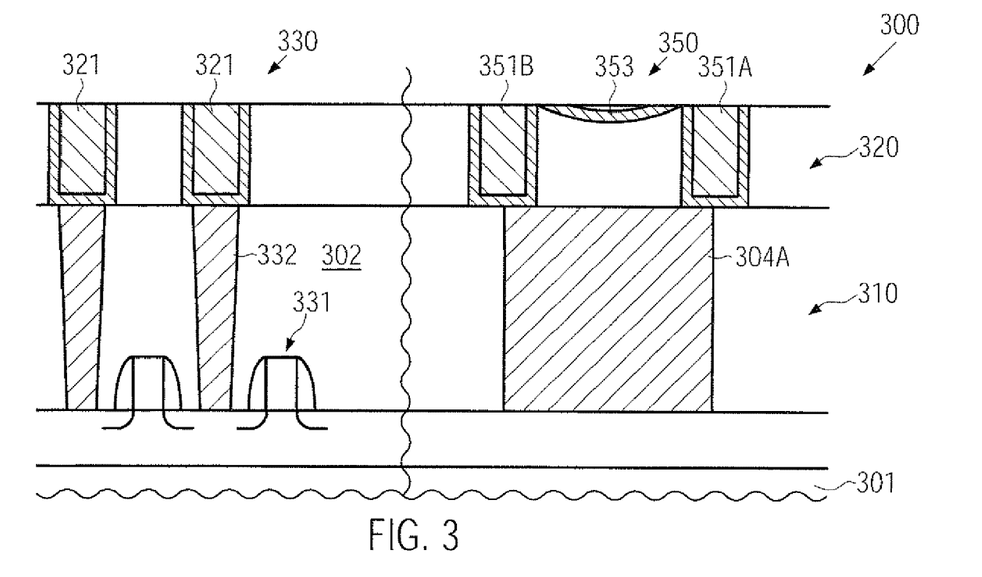
FIG. 3 schematically illustrates a cross-sectional view of a device region and a test area of a semiconductor device in which a CMP process used for the first metallization level is evaluated on the basis of a test structure of increased sensitivity according to illustrative embodiments.

FIG. 3 schematically illustrates a cross-sectional view of a semiconductor device 300 in which a test structure with increased sensitivity with respect to variations of a CMP process may be provided in the very first metallization level. Thus, as shown, the semiconductor device 300 may comprise a substrate 301, which may have substantially the same configuration as previously described with respect to the substrates 101 and 201. In the embodiment shown, the substrate 301 may represent a product substrate including a device region 330 and one or more test structures 350, which may be provided in the frame area of respective die regions or in any other dedicated test areas of the substrate 301. Furthermore, the device 300 may comprise a device layer 310 in which respective circuit elements 331 may be provided, such as transistors, capacitors, resistors and the like, which are embedded in an interlayer dielectric material 302. It should be appreciated that respective circuit elements, such as resistors and the like, (not shown) may also be provided in the device layer 310 at areas that correspond to the test structure 350, if desired. Furthermore, respective contacts 332, which may, for instance, be comprised of tungsten or any appropriate material, may be formed in the interlayer dielectric material 302 and may connect to metal lines 321 of the first metallization layer 320. Similarly, a metal region 304A may be provided in the test structure 350, wherein a lateral size of the metal region 304A may be selected to create a desired high probability for creating a leakage path between metal regions 351A, 351B of the test structure 350. Hence, a leakage region 353 may be formed between the regions 351A, 351B, wherein the leakage region 353 may actually contact the regions 351A, 351B, depending on the performance of a respective CMP process. Furthermore, in other illustrative embodiments, a plurality of test structures 350 each having a different probability of creating a leakage path may be provided so that some of the respective leakage regions 353 may not actually contact the corresponding metal regions 351A, 351B, while others may be in contact, as is previously explained.

The device 300 as shown in FIG. 3 may be formed on the basis of well-established process techniques for forming the circuit elements 331 in the device layer 310 followed by the deposition of the interlayer dielectric material 302 and the formation of the contacts 332. Contrary to conventional approaches, however, the region 304A may be formed, for instance, by intentionally violating the design rules for the layer 310 in order to generate a desired recessed surface topography during the formation of the metallization layer 320. The metallization layer 320 may be formed on the basis of well-established techniques while also patterning the one or more test structures 350, which may have a different probability for creating a leakage path by varying the size of the metal region 304A and/or the lateral distance between the metal regions 351A, 351B, as is also explained above when referring to the device 200. Thus, the test structure 350 may also be advantageously used for assessing a CMP process used for the formation of the very first metallization level 320.

Figure 4:
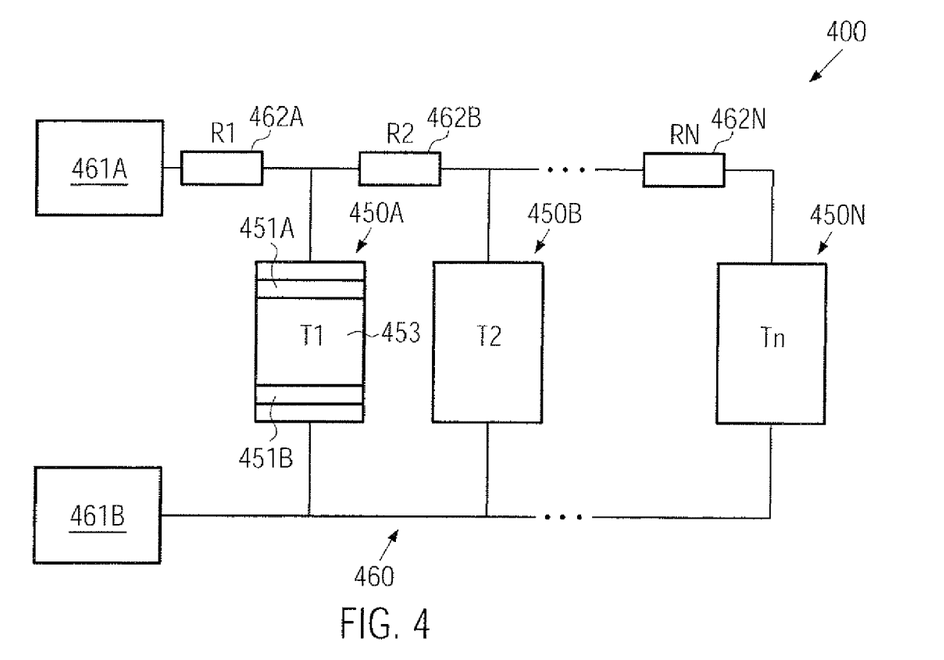
FIG. 4 schematically illustrates a test region including a plurality of test structures in combination with an interconnect structure, thereby allowing the concurrent connection of the plurality of test structures with an external electrical test tool with a reduced number of probe pads according to illustrative embodiments.

FIG. 4 schematically illustrates a test device 400 including a plurality of test structures 450A, 450B, 450N, each of which may have a configuration as previously described with reference to the test structures 250 or 350. That is, each of the test structures 450A, 450B, 450N may comprise a respective pair of metal regions 451A, 451B with a leakage region 453 defined therebetween which may have a different probability for creating an actual leakage path due to a respective recessed surface topography caused by an underlying material layer. Furthermore, the device 400 may comprise an interconnect structure 460, which is schematically illustrated as simple lines, while it should be appreciated that, in an actual configuration, the interconnect structure 460 may comprise metal lines and metal regions, possibly in different metallization levels, to connect to the metal regions 451A, 451B, respectively. In the embodiment shown, the interconnect structure 460 is configured such that each of the plurality of test structures 450A, 450B, 450N is concurrently connected to respective probe pads 461A, 461B which may be accessible by respective probes of an external measurement tool, such as a tool for resistance measurement, current measurement and the like. Furthermore, the interconnect structure 460 may comprise a plurality of resistive circuit elements 462A, 462B, 462N which may be represented by any appropriate devices, such as doped semiconductor elements in the device level of the device 400. Thus, in the embodiment shown, the test structures 450A, 450B, 450N may be defined as "switches" during a respective CMP process when forming the respective metallization level, as previously explained, wherein it may be assumed that the test structure 450A may have the lowest probability for creating a leakage path while the test structure 450N may have the highest probability. If, for example, the performance of the CMP process is such that metal residues may not be sufficiently removed from all of the test structures except for the test structure 450A, i.e., the "switches" 450B, 450N are closed, the resistance measured between the probe pads 461A, 461B may be substantially defined by the resistors 462A, 462B which may have a significantly higher value compared to the resistance of a typically established leakage path. Thus, based on the determined resistance value, the number of non-shorted test structures may be determined, in the present example test structure 450A, thereby obtaining a quantitative evaluation of the respective CMP process. Consequently, a plurality of test structures may be provided while only requiring a low number of probe pads, which essentially determine the overall amount of area required for a respective test structure. It should be appreciated that other wiring schemes may be used for the interconnect structure and the respective resistive circuit elements 462A, 462B, 462N so as to identify the test structure not having a leaking "leakage path" 453. For example, the test structures 450 in combination with an associated resistive circuit element may be connected in parallel and the resulting total resistance may be evaluated.

As a result, the subject matter disclosed herein provides techniques and test devices in which an increased sensitivity for evaluating a CMP process may be obtained by intentionally creating a recessed surface topography below a metallization layer, for instance by providing a large metal pad. Consequently, upon forming the overlying metallization layer on the basis of well-established inlaid techniques, the respective recessed surface topography may also affect the deposition processes during the formation of the metallization layer and may therefore also affect the CMP process for removing any excess metal. Therefore, the probability of maintaining metal residues may be increased, thereby also increasing the probability of creating leakage paths between respective metal lines that may be formed in the metallization level aligned to the recessed surface topography. Thus, the sensitivity of creating a leakage path may be extended and may no longer be restricted to a minimum critical distance between adjacent metal lines. Furthermore, by providing a plurality of corresponding leakage test structures, each of which may have a different probability for creating a leakage path, a desired high resolution of measurement sensitivity and an increased measurement range may be obtained, even if each test structure may only provide digital "yes/no" information.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a first metallization layer of a test area for a semiconductor device on the basis of a first set of design rules for a device region of said semiconductor device;
   forming a metal region in said first metallization layer on the basis of design rules that violate said first set of design rules;
   generating a recessed surface area in said first metallization layer by performing a first chemical mechanical polishing process on said first metallization layer to remove excess metal of said metal region;
   forming a first metal region and a second metal region in a first leakage area of a second metallization layer formed on said first metallization layer by filling openings in said leakage area with a metal and removing excess metal by performing a second chemical mechanical polishing process, said leakage area being aligned to said recessed surface area; and
   evaluating said second chemical mechanical polishing process by determining a leakage current between said first and second metal regions.

2. The method of claim 1, further comprising generating a second recessed surface area in said first metallization layer of said test area on the basis of said first chemical mechanical polishing process and forming a first metal region and a second metal region in a second leakage area on the basis of said second chemical mechanical polishing process.

3. The method of claim 2, wherein said first and second leakage areas differ from each other in at least one of a lateral spacing between the respective first and second metal regions of said first and second leakage areas and a lateral extension of said first and second leakage areas.

4. The method of claim 1, wherein said test area is provided above a dedicated test substrate.

5. The method of claim 1, wherein said test area is provided in a product substrate comprising a plurality of said semiconductor devices.

6. The method of claim 1, wherein said metal region in said first metallization layer is formed by using a copper-containing metal.

7. The method of claim 1, wherein said metal region in said first metallization layer is formed by using a tungsten-containing metal.

8. The method of claim 1, wherein forming said metal region in said first metallization layer comprises forming a plurality of closely spaced openings in said first metallization layer and filling said plurality of closely spaced openings with a metal.

9. A method for evaluating a chemical mechanical polishing process, the method comprising:
   forming a leakage test structure by:
      forming a layer portion of a material layer in a test area of a semiconductor device so as to have a laterally defined recessed surface topography;
      forming a metallization layer above said material layer using said chemical mechanical polishing process for removing excess metal of said metallization layer, said metallization layer comprising a first metal region and a second metal region, said first and second metal regions formed above said layer portion and having a lateral distance according to a predefined target value, said predefined target value being selected whereby there is a greater probability of creating a current leakage path between said first and second metal regions after performing said chemical mechanical polishing process than between adjacent metal regions formed on the basis of device design rules in a metallization layer of a device region of said semiconductor device; and
   determining a leakage current in said leakage test structure to evaluate said chemical mechanical polishing process.

10. The method of claim 9, wherein forming said layer portion comprises preparing said layer portion at least partially so as to have a reduced removal rate during a specified chemical mechanical polishing process and performing said specified chemical mechanical polishing process to remove excess material of said material layer.

11. The method of claim 10, wherein preparing said layer portion at least partially so as to have a reduced removal rate comprises forming one or more openings in a dielectric material of said material layer and refilling said one or more openings with a metal and removing excess metal by said specified chemical mechanical polishing process to provide one or more metal regions.

12. The method of claim 11, wherein one metal region is provided as a metal pad.

13. The method of claim 9, further comprising forming one or more further leakage test structures, said leakage test structure and said one or more further leakage test structures differing in a probability of creating a current leakage path during said chemical mechanical polishing process.

14. The method of claim 13, wherein forming said one or more further leakage test structures comprises forming one or more further layer portions so as to have a laterally defined recessed surface topography and forming for each of said one or more further layer portions a respective first metal region and a respective second metal region in said metallization layer, each of said one or more further leakage test structures differing in at least one of a lateral dimension of said recessed surface topographies and a lateral distance of said first and second metal regions.

15. The method of claim 14, wherein said leakage test structure and each of said one or more further leakage test structures differ in said lateral dimensions of said recessed surface topographies.

16. The method of claim 14, wherein said leakage test structure and each of said one or more further leakage test structures differ in said lateral distances of said first and second metal regions.

17. The method of claim 1, wherein forming said metal region in said first metallization layer comprises forming an opening in said first metallization layer and filling said opening with a metal.

* * * * *